United States Patent
Bae et al.

(10) Patent No.: US 6,917,085 B2
(45) Date of Patent: Jul. 12, 2005

(54) SEMICONDUCTOR TRANSISTOR USING L-SHAPED SPACER

(75) Inventors: Geum-Jong Bae, Kyunggi-do (KR); Nae-In Lee, Seoul (KR); Hwa-Sung Rhee, Seoul (KR); Young-Gun Ko, Seoul (KR); Tae-Hee Choe, Seoul (KR); Sang-Su Kim, Yongin-shi (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/728,811

(22) Filed: Dec. 8, 2003

(65) Prior Publication Data

US 2004/0079976 A1 Apr. 29, 2004

Related U.S. Application Data

(62) Division of application No. 10/103,759, filed on Mar. 25, 2002, now Pat. No. 6,693,013.

(30) Foreign Application Priority Data

Jun. 2, 2001 (KR) .......................................... 2001-31030

(51) Int. Cl.[7] .............................................. H01L 29/76
(52) U.S. Cl. ...................... 257/408; 257/335; 257/336; 257/337; 257/339; 257/343; 257/344; 257/346
(58) Field of Search ................................. 257/336, 408; 438/184, 230, 215, 303, 348

(56) References Cited

U.S. PATENT DOCUMENTS

| | | | | |
|---|---|---|---|---|
| 5,770,508 A | * | 6/1998 | Yeh et al. ................... | 438/305 |
| 5,783,475 A | * | 7/1998 | Ramaswami ................ | 438/303 |
| 5,793,089 A | | 8/1998 | Fulford, Jr. et al. | |
| 6,013,569 A | * | 1/2000 | Lur et al. .................... | 438/595 |
| 6,083,846 A | | 7/2000 | Fulford et al. | |
| 6,153,483 A | * | 11/2000 | Yeh et al. .................... | 438/299 |
| 6,156,598 A | | 12/2000 | Zhou et al. | |
| 6,207,519 B1 | | 3/2001 | Kim et al. | |
| 6,440,875 B1 | * | 8/2002 | Chan et al. ................. | 438/778 |
| 6,495,900 B1 | | 12/2002 | Mouli et al. | |
| 6,506,650 B1 | * | 1/2003 | Yu .............................. | 438/301 |

FOREIGN PATENT DOCUMENTS

FR   2760130   * 8/1998   ......... H01L/21/336

OTHER PUBLICATIONS

Peter Van Zant; Microchip Fabrication—A practical guide to Semiconductor Processing (2000), McGraw–Hill, Fourth Edition, pp. 348–349.*

* cited by examiner

Primary Examiner—Craig A. Thompson
Assistant Examiner—David L. Hogans
(74) Attorney, Agent, or Firm—Lee & Morse, P.C.

(57) ABSTRACT

The present invention provides a semiconductor transistor using an L-shaped spacer. The semiconductor transistor includes a gate pattern formed on a semiconductor substrate and an L-shaped third spacer formed beside the gate pattern and having a horizontal protruding portion. An L-shaped fourth spacer is formed between the third spacer and the gate pattern, and between the third spacer and the substrate. A high-concentration junction area is positioned in the substrate beyond the third spacer, and a low-concentration junction area is positioned under the horizontal protruding portion of the third spacer. A medium-concentration junction area is positioned between the high- and low-concentration junction areas.

4 Claims, 6 Drawing Sheets

SEMICONDUCTOR TRANSISTOR USING L-SHAPED SPACER

This application is a division of application Ser. No. 10/103,759, filed Mar. 25, 2002, now U.S. Pat. No. 6,693,013.

BACKGROUND OF THE INVENTION

1. Field of the Invention

The present invention generally relates to a semiconductor device. More specifically, the present invention is directed to a semiconductor transistor using an L-shaped spacer.

2. Description of the Related Art

As semiconductor devices become more highly integrated, there is an increased demand for a method of suppressing a short channel effect. To this end, a commonly used structure is a lightly doped drain (LDD) structure where a low-concentration junction area is located on a lateral surface of a high-concentration junction area in a drain.

FIG. 1 and FIG. 2 are sectional diagrams for explaining a method of forming a conventional semiconductor transistor.

Referring now to FIG. 1, a gate oxide layer pattern 11 and a gate conductive layer pattern 12 are sequentially formed on a semiconductor substrate 10. A first oxide layer 13 is formed on the entire surface of the substrate including the gate conductive layer pattern 12. Using the gate conductive layer pattern 12 as an ion implantation mask, an LDD ion implantation process is carried out to form a low-concentration junction area 16 in the substrate 10 beyond the gate conductive layer pattern 12.

A silicon nitride layer 14 and a second oxide layer (not shown) are formed on the entire surface of the substrate including the low-concentration junction area 16. The second oxide layer is anisotropically etched to form a first spacer 15 on a lateral surface of the silicon nitride layer 14.

Referring now to FIG. 2, using the first spacer 15 as an etch mask, the silicon nitride layer 14 is isotropically etched to form an L-shaped second spacer 17 positioned between the first oxide layer 13 and the first spacer 15. Using the first spacer 15 and the gate conductive layer pattern 12 as an ion implantation mask, a high-concentration ion implantation process is carried out to form a high-concentration junction area 18 in the substrate 10 at both sides of the first spacer 15. For activation of impurities contained in the high-concentration junction area 18, an annealing process for the substrate that has undergone a high-concentration ion implantation process is carried out. However, impurities pre-implanted into the low-concentration junction area 16 are also diffused during the annealing process. In order to prevent the diffusion of the pre-implanted impurities, a method changing the order of steps to a high-concentration ion implantation process, an annealing process, and a low-concentration ion implantation process may be employed.

Unfortunately, the resistance of a source/drain region is high due to a low impurity concentration of the low-concentration junction area 16. A method of forming a medium-concentration junction area between the high- and low-concentration junction areas has been used to overcome this disadvantage.

FIG. 3 through FIG. 5 are sectional diagrams for explaining a method of forming a medium-concentration junction area between the high- and low-concentration junction areas, according to the prior art. In this case, the low-concentration junction area is formed following an annealing process.

Referring now to FIG. 3, a gate oxide layer pattern 51 and a gate conductive layer pattern 52 are sequentially formed on a semiconductor substrate 50. A nitride layer 55 and a polysilicon layer (not shown) are sequentially formed on the entire surface of the substrate including the gate conductive layer pattern 52. The polysilicon layer is anisotropically etched to form a first spacer 60 in contact with a sidewall of the nitride layer 55. An exposed surface of the first spacer 60, which is made of polysilicon, is oxidized to form a second spacer 62.

Using the second spacer 62 as an ion implantation mask, a source/drain ion implantation process 80 is carried out to form a high-concentration junction area 81 in the substrate 50 at both sides of the second spacer 62.

Referring to FIG. 4, after forming the high-concentration junction area 81, the second spacer 62 is removed to expose the first spacer 60. Using the first spacer 60 as an ion implantation mask, a medium-concentration ion implantation process 82 is carried out to form a medium-concentration junction area 83 in the substrate 50 at both sides of the first spacer 60. An annealing process is then carried out for the substrate including the medium-concentration junction area 83.

In FIG. 5, after removal of the first spacer 60, using the sidewall of the nitride layer 55 as an ion implantation mask, a low-concentration ion implantation process 84 is carried out to form a low-concentration junction area 85 in the substrate 50 at both sides of the sidewall of the nitride layer 55.

Based upon the above-explained method in FIG. 3 through FIG. 5, a medium-concentration junction area 83 is formed between low-concentration junction area 85 and high-concentration junction area 81, thereby reducing the resistance of the source/drain region. Unfortunately, the above-explained method is not efficient in that an ion implantation process must be carried out three times in order to form a medium-concentration junction area between a low- and a high-concentration junction area.

Accordingly, a feature of an embodiment of the present invention is to provide a method of fabricating a semiconductor transistor capable of minimizing the diffusion of impurities in the low-concentration junction area and reducing the resistance of the low-concentration junction area.

Another feature of an embodiment of the present invention is to provide a semiconductor transistor including a low-concentration junction area where impurities are minimally diffused, and including a medium-concentration junction area for reducing the resistance of the low-concentration junction area.

SUMMARY OF THE INVENTION

The present invention provides a method of fabricating a semiconductor transistor, which undergoes an annealing process and a low-concentration junction area forming process after simultaneously forming medium- and high-concentration junction areas using an L-shaped spacer. In accordance with the present invention, after forming a gate pattern on a semiconductor substrate, a first insulating layer is formed on the resulting structure. L-shaped third and second spacers are sequentially stacked on the first insulating layer that is formed on a sidewall of the gate pattern. Each of the second and third spacers has a horizontal protruding portion.

Using a sidewall of the second spacer and the gate pattern as an ion implantation mask, a high-concentration ion implantation process is carried out to form simultaneously high- and medium-concentration junction areas in the substrate beyond the second spacer and in the substrate under the horizontal protruding portion of the second spacer, respectively. After annealing the semiconductor substrate, which was subjected to the high-concentration ion implantation process, the second spacer is removed. Using a sidewall of the third spacer and the gate pattern as an ion implantation mask, a low-concentration ion implantation process is carried out to form a low-concentration junction area in the substrate under the horizontal protruding portion of the third spacer.

In the formation of the third and second spacers, second, third, and fourth insulating layers are sequentially stacked on the first insulating layer. The fourth insulating layer is anisotropically etched to form a first spacer on the sidewall of the third insulating layer. Using the first spacer as an etch mask, the third insulating layer is etched to form an L-shaped second spacer having a horizontal protruding portion under the first spacer. The second insulating layer is etched during the removal of the first spacer to form an L-shaped third spacer having a horizontal protruding portion under the second spacer.

The medium- and high-concentration junction areas are formed to make the medium-concentration junction area have a lower impurity concentration than the high-concentration junction area, using the protruding portions of the second and third spacers and the first insulating layer as an ion channeling barrier layer in the high-concentration ion implantation process. Preferably, the annealing process is a rapid thermal process (RTP).

According to the present invention, a semiconductor transistor includes a gate pattern formed on a semiconductor substrate, an L-shaped third spacer, which is formed on a lateral surface of the gate pattern and has a horizontal protruding portion, an L-shaped fourth spacer having a sidewall between a sidewall of the third spacer and the gate pattern and a horizontal protruding portion between the protruding portion of the third spacer and the substrate, a high-concentration junction area formed in the substrate beyond the third spacer, a low-concentration junction area formed under the horizontal protruding portion of the third spacer, and a medium-concentration junction area positioned between the high- and low-concentration junction areas.

The medium- and low-concentration junction areas are formed under the protruding portion of the third spacer. Preferably, the fourth and second spacers are made of silicon oxide and the third spacer is made of either silicon nitride or silicon oxynitride having an etch selectivity with respect to the fourth spacer.

In an embodiment of the present invention, the third spacer is removed before a low concentration ion-implantation process is performed.

In another embodiment of the present invention, a silicon oxide layer is formed on the substrate before a low concentration ion-implantation process is performed.

These and other features of the present invention will be readily apparent to those of ordinary skill in the art upon review of the detailed description that follows.

DETAILED DESCRIPTION OF THE INVENTION

Figure 1:
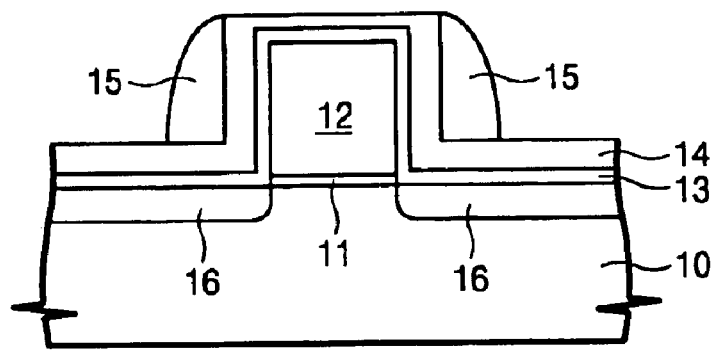
FIG. 1 and FIG. 2 are sectional diagrams illustrating the fabrication process of a conventional semiconductor transistor.
Figure 2:
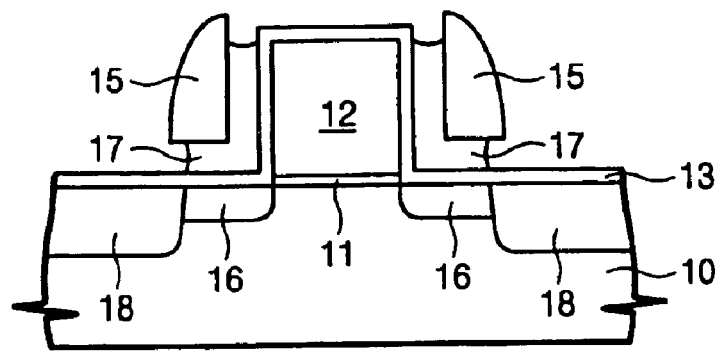
Figure 3:
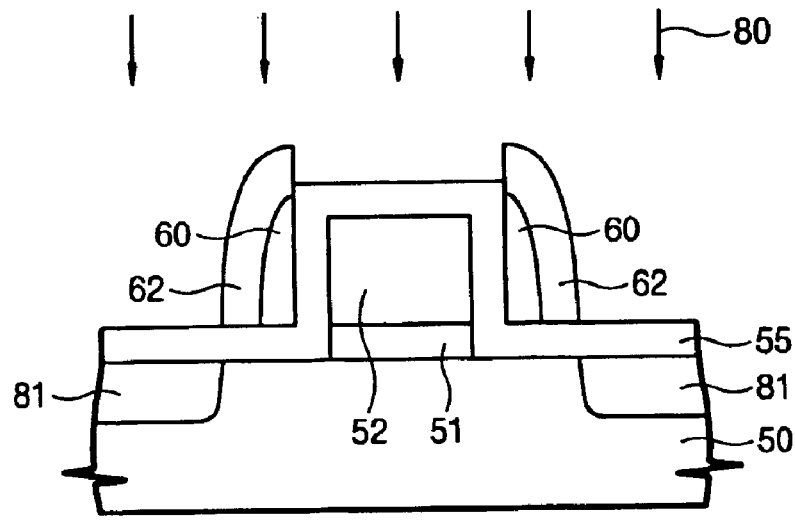
FIG. 3 through FIG. 5 are sectional diagrams illustrating the fabrication process of another conventional semiconductor transistor.
Figure 4:
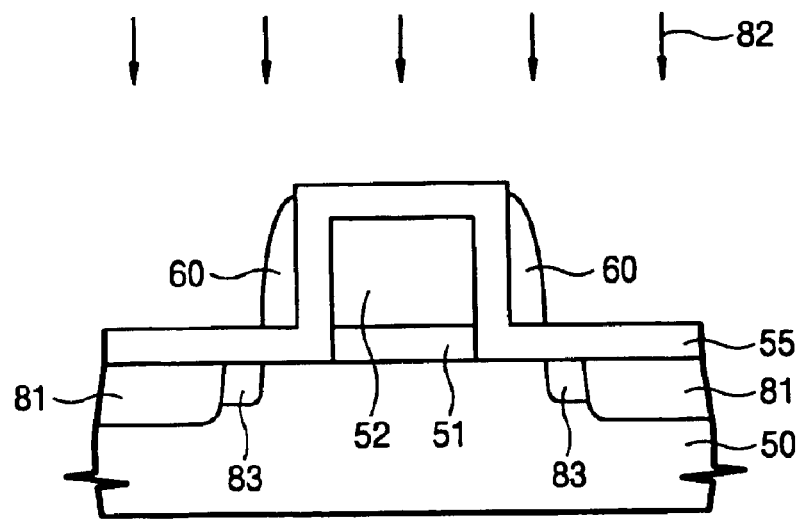
Figure 5:
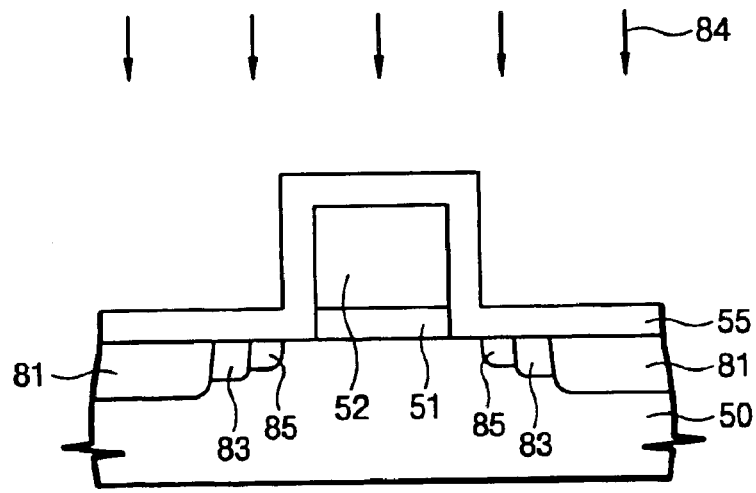

Korean Patent Application No. 2001-31030, filed on Jun. 2, 2001, and entitled: "Semiconductor Transistor Using L-shaped Spacer and Method of Fabricating the Same," is incorporated by reference herein in its entirety.

The present invention will now be described more fully hereinafter with reference to the accompanying drawings, in which preferred embodiments of the present invention are shown. The present invention may, however, be embodied in different forms and should not be construed as limited to the embodiments set forth herein. Rather, these embodiments are provided so that this disclosure will be thorough and complete, and will fully convey the scope of the invention to those of ordinary skill in the art. In the drawings, the thickness of layers and regions are exaggerated for clarity. It will also be understood that when a layer is referred to as being "on" another layer or substrate, it may be directly on the other layer or substrate, or intervening layers may also be present. It will also be understood that when a layer is referred to as being "under" another layer, it may be directly under the other layer, or intervening layers may also be present.

FIG. 6 through FIG. 10 are sectional diagrams for explaining the process of fabricating a semiconductor transistor according to a preferred embodiment of the present invention.

Figure 6:
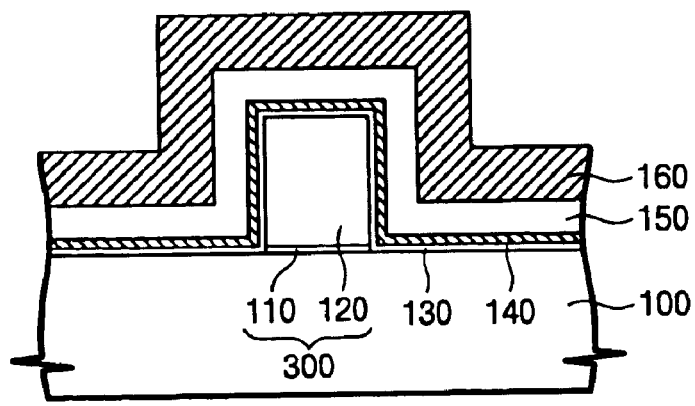
FIG. 6 through FIG. 10 are sectional diagrams illustrating the fabrication process of a semiconductor transistor according to a preferred embodiment of the present invention.

Referring now to FIG. 6, a gate oxide layer pattern 110 and a gate conductive layer pattern 120 are sequentially stacked on a semiconductor substrate 100 to form a gate pattern 300. First, second, third, and fourth insulating layers 130, 140, 150, and 160 are sequentially formed on the entire surface of the substrate including the gate pattern 300. Preferably, the first insulating layer 130 is formed by a thermal oxidation process or a chemical vapor deposition (CVD) process in order to enhance electrical characteristics of the gate pattern 300 and to prevent stress from being applied to the substrate 100. Also preferably, the second, third, and fourth insulating layers 140, 150, and 160 are each made of a material having an etch selectivity with respect to their underlying insulating layers, i.e., the first, second, and third insulating layers 130, 140, and 150. Therefore, it is preferable that the second and fourth insulating layers 140 and 160 are made of either silicon nitride or oxynitride, and the third insulating layer 150 is made of oxide.

Preferably, the first insulating layer 130 is formed to a thickness of between about 2 nm–5 nm. Also preferably, a sum of the thickness of the first and second insulating layers 130 and 140 is between about 5 nm–20 nm.

Figure 7:
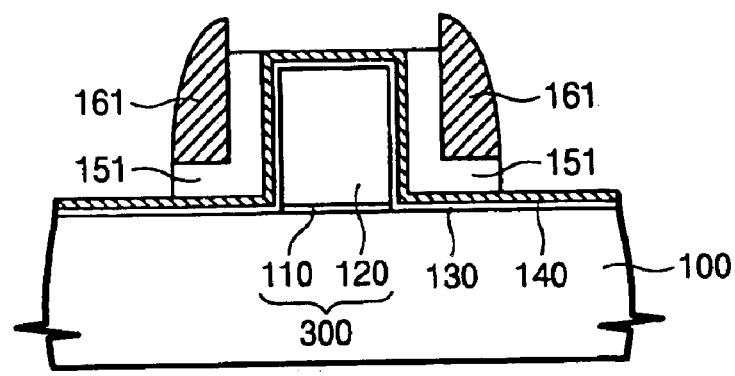

Referring now to FIG. 7, the fourth insulating layer 160 is anisotropically etched to form a first spacer 161 of a conventional shape on a sidewall of the third insulating layer 150. Using the first spacer 161 as an etch mask, the third insulating layer 150 is etched to form an L-shaped second spacer 151 positioned between the second insulating layer 140 and the first spacer 161. In other words, the second spacer 151 is an L-shaped spacer having a horizontal protruding portion extending under the first spacer 161.

Preferably, the etching process for forming the second spacer 151 is an anisotropic etching process carried out by a silicon oxide etching recipe having an etch selectivity with respect to silicon nitride. As a result, the second insulating layer 140 made of silicon nitride or oxynitride acts as an etch-stop layer during the etching process for forming the second spacer 151, as illustrated in FIGS. 6 and 7.

As a result of the above process, the substrate, including the gate pattern 300, is covered with the sequentially-stacked first and second insulating layers 130 and 140. The L-shaped second spacer 151 is located on a lateral surface of the second insulating layer 140, and the first spacer 161 is located on the horizontal protruding portion of the second spacer 151. The second insulating layer 140 is exposed beyond the second spacer 151 and on the gate pattern 300.

Figure 8:
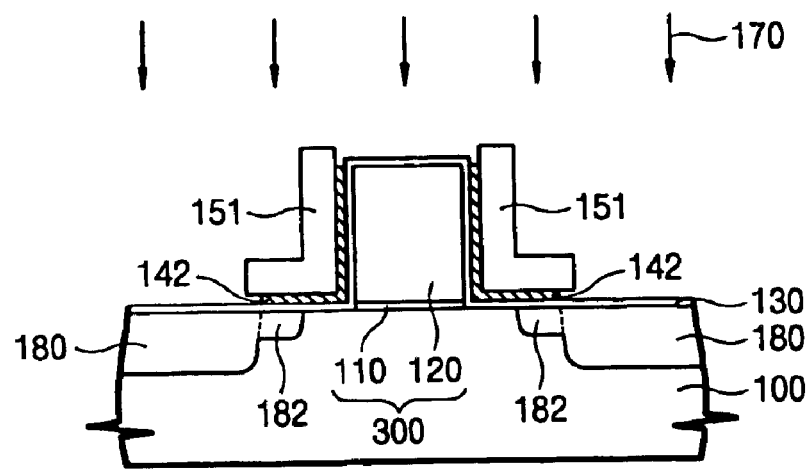

Referring now to FIG. 8, using a silicon nitride layer etching recipe having an etch selectivity with respect to silicon oxide, the structure is etched to remove the first spacer 161. Preferably, an etching process for removing the first spacer 161 is performed using an isotropic etching technique. As described above in the detailed description of FIG. 7, the second insulating layer 140, made of silicon nitride or oxynitride, is exposed beyond the second spacer 151 and on the gate pattern 300. Accordingly, the exposed second insulating layer 140 is also etched during the nitride layer etching process for removing the first spacer 161. However, the first insulating layer made of silicon oxide acts as an etch-stop layer during the etching process for removing the first spacer 161, as described in connection with FIG. 6. Thus, an L-shaped third spacer 142 is formed between the second spacer 151 and the first insulating layer 130, and the first insulating layer 130 is exposed beyond the second spacer 151 and on the gate pattern 300.

The first insulating layer 130 is a thin material layer having a thickness of between about 2 nm–5 nm, as described in connection with FIG. 6. Therefore, it is preferable that the silicon nitride layer etching process for removing the first spacer 161 and etching the second insulating layer 140 beyond the second spacer 151 uses an etching recipe having an etch selectivity as high as possible.

Using the gate pattern 300 and a horizontal protruding portion of the second spacer 151 as an implantation mask, a high-concentration ion implantation process 170 is carried out to form simultaneously high- and medium-concentration junction areas 180 and 182 in the substrate 100 beyond the second spacer 151 and in the substrate 100 under the horizontal protruding portion of the second spacer 151, respectively.

In this case, the first insulating layer 130 is used as an ion channeling barrier layer for forming the high-concentration junction area 180 during the high-concentration ion implantation process 170. Also the first insulating layer 130, the horizontal protruding portion of the third spacer 142, and the horizontal protruding portion of the second spacer 151 are used as an ion channeling barrier layer for forming the medium-concentration junction area 180 during the ion implantation process 170.

Generally, an implant concentration depth profile of impurities implanted by an ion implantation process represents a gaussian distribution from the surface. Therefore, a projected range ($R_p$) is formed at a position that is deeper than an exposed surface. Due to the implant masking action of the horizontal protruding portions of the second and third spacers 151 and 142, an $R_p$ of the medium-concentration junction area 182 is formed at a higher position than an $R_p$ of the high-concentration junction area 180. The $R_p$ of the medium-concentration junction area 180 is formed on the substrate 100 by controlling the thickness of the second spacer 151. As a result, an impurity concentration in the medium-concentration junction area 182 may be lower than an impurity concentration in the high-concentration junction area 180. Therefore, the thickness of the third insulating layer 150, etched to form the second spacer 151, is a processing parameter that must be determined in view of an ion energy of the high-concentration ion implantation process 170. In this embodiment, the thickness of the third insulating layer 150 is preferably between about 20 nm–70 nm.

The thickness of the fourth insulating layer 160 is a processing parameter to determine not only the thickness of the first spacer 161 but also a spacing between the high-concentration junction area 180 and the gate pattern 300. In this embodiment, the thickness of the fourth insulating layer 160 is preferably between about 30 nm–90 nm.

The impurities implanted by the high-concentration ion implantation process 170, cause lattice damage to the semiconductor substrate 100, and most of the implanted impurity atoms are not able to form a covalent bond with silicon atoms. Therefore, the substrate 100 is preferably annealed at a temperature of 1000° C. for 30 seconds. As a result, the impurities implanted into the high-concentration junction area 180 and the medium-concentration junction area 182 become active and the lattice damage of the silicon atoms is cured. Preferably, the annealing process is a rapid thermal process to minimize diffusion of the implanted impurities.

Figure 9:
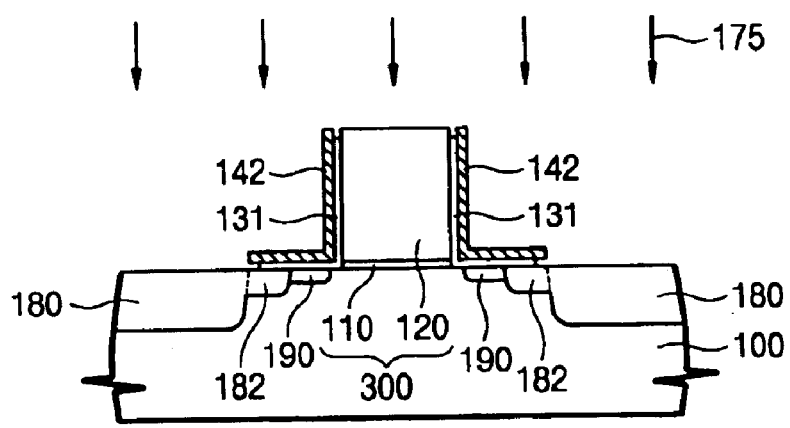

Referring to FIG. 9, the semiconductor substrate that has undergone the annealing process is etched to remove the second spacer 151. Preferably, the etching process is an isotropic etching process using an oxide etching recipe having an etch selectivity with respect to a nitride layer. Accordingly, the first insulating layer 130 exposed on the gate pattern 300 and beyond the second spacer 151 is also etched to expose top surfaces of the gate pattern 300 and the high-concentration junction area 180. This results in a formation of an L-shaped fourth spacer 131 having a horizontal protruding portion under the third spacer 142.

Since the first insulating layer 130 is thinner than the second spacer 151, the first insulating layer 130 is overetched during the etching process for removing the second spacer 151. Thus, the L-shaped fourth spacer 131 has an under-cut horizontal protruding portion under the third spacer 142 and a recessed sidewall on a lateral surface of the gate pattern 300. This profile of the fourth spacer 131 is preferable in that a larger silicide reaction area is formed in a subsequent process for forming a silicide layer on the gate pattern 300.

Using the sidewalls of the third and fourth spacers 142 and 131 and the gate conductive layer pattern 120 as an ion implantation mask, a low-concentration ion implantation process 175 is carried out on the substrate where the fourth spacer 131 is formed. Thus, a low-concentration junction area 190 is formed in the substrate 100 under the horizontal protruding portion of the third spacer 142. The medium-concentration junction area 182 is also formed in the substrate 100 under the horizontal protruding portion of the third spacer 142. However, the junction areas 182 and 190 differ in that the medium-concentration junction area 182 is formed only in the substrate under the horizontal protruding portion of the second spacer 151 and is not formed under a vertical sidewall of the second spacer 151. That is, the low-concentration junction area 190 is formed between the medium-concentration junction area 182 and the area of the substrate 100 under the gate pattern 300.

Since the third spacer 142 is thin, it may be overetched so as to be removed during the process for removing the second spacer 151 or it may be removed by controlling an etch selectivity with respect to the fourth spacer 131. After the third spacer 142 is removed, only the fourth spacer 131 remains out of the ion channeling barrier layer during the low-concentration ion implantation process 175. Thus, the low-concentration junction area 190 may be formed using a lower ion energy. An ion implantation process using a low ion energy is preferable to formation of a shallow junction area in that an ion dispersion can become lower. Thus, the low-concentration ion implantation process 175 may be carried out after removal of the third spacer 142.

Since all material layers to be used as an ion implantation channeling barrier layer are etched on the high-concentration junction area 180, ion channeling may occur during the low-concentration ion implantation process 175. However, the pre-formed high-concentration junction area 180 is deeper than the low-concentration ion junction area 190 and the low-concentration ion implantation process 175 requires less ion energy and a small amount of the implanted impurities. Therefore, the ion channeling is not severe. In order to completely remove the ion channeling, a silicon oxide layer may be formed, by a thermal oxidation process or a CVD process, before the low-concentration ion implantation process 175.

Figure 10:
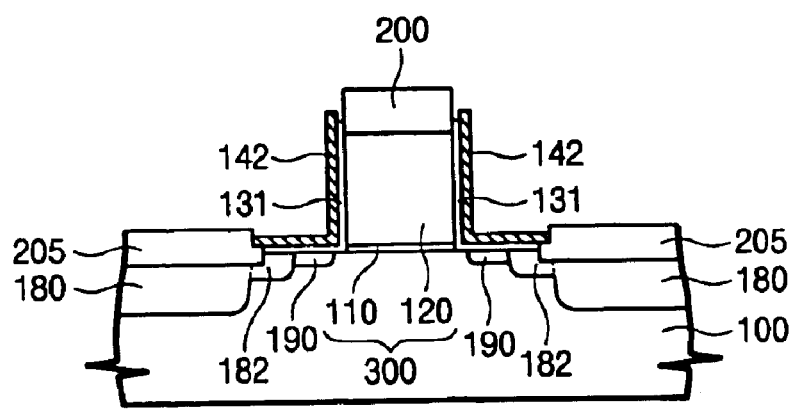

Referring now to FIG. 10, a gate silicide layer 200 and a junction area silicide layer 205 are formed on the gate conductive layer pattern 120 and the high-concentration junction area 180, each having an exposed top surface, respectively. The gate silicide layer 200 is generally thicker than the junction area silicide layer 205 because of a crystalline level difference between the gate conductive layer pattern 120, which is polycrystalline, and the semiconductor substrate 100, which is a single crystal. Furthermore, a sufficient reaction area may be secured because the top surface of the fourth spacer 131 is recessed lower than the top surface of the gate pattern 300, as described above. As a result, the gate silicide layer 200 is more stably formed and is thicker than in the case of a non-recessed fourth spacer 131.

Figure 11:
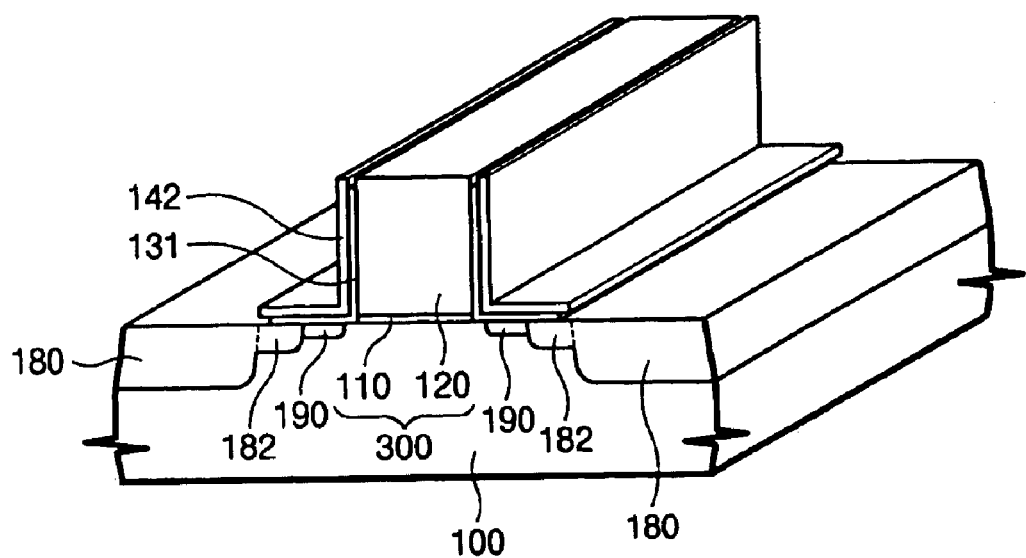
FIG. 11 illustrates a perspective view of a semiconductor transistor according to a preferred embodiment of the present invention.

FIG. 11 illustrates a perspective view of a semiconductor transistor according to a preferred embodiment of the present invention. Referring now to FIG. 11, a gate pattern 300 is positioned on a semiconductor substrate 100. The gate pattern 300 includes a gate oxide layer pattern 110 and a gate conductive layer pattern 120 that are sequentially stacked. An L-shaped third spacer 142 having a horizontal protruding portion is positioned beside the gate pattern 300. Preferably, the third spacer 142 is made of nitride or oxynitride.

An L-shaped fourth spacer 131 is positioned so that it has a vertical sidewall between a vertical sidewall of the third spacer 142 and the gate pattern 300, and a horizontal protruding portion between the protruding portion of the third spacer 142 and the substrate 100. Preferably, the fourth spacer 131 is made of oxide.

A high-concentration junction area 180 is positioned in the substrate 100 beyond the third spacer 142, and a low-concentration junction area 190 is positioned in the substrate 100 under the horizontal protruding portion of the third spacer 142. A medium-concentration junction area 182 is positioned between the high- and low-concentration junction areas 180 and 190. The medium- and low-concentration junction areas 182 and 190 are formed under the horizontal protruding portion of the third spacer.

In summary, high- and medium-concentration junction areas are formed simultaneously. After an annealing process is carried out to activate impurities, a low-concentration junction area is formed. Therefore, it is possible to minimize the diffusion of implanted impurities and reduce the resistance of a source/drain region.

A preferred embodiment of the present invention has been disclosed herein and, although specific terms are employed, they are used in a generic and descriptive sense only and not for purpose of limitation. Accordingly, it will be understood by those of ordinary skill in the art that various changes in form and details may be made without departing from the spirit and scope of this invention as defined by the appended claims.

What is claimed is:

1. A semiconductor transistor comprising:

a gate pattern formed on a semiconductor substrate;

an L-shaped upper spacer having a horizontal protruding portion protruding from a vertical portion thereof, the upper spacer being formed on a sidewall surface of the gate pattern;

an L-shaped lower spacer having a vertical sidewall between a vertical sidewall of the L-shaped upper spacer and the gate pattern and a horizontal protruding portion protruding from the vertical sidewall thereof between the horizontal protruding portion of the L-shaped upper spacer and the substrate, the horizontal protruding portion of the L-shaped upper spacer extending beyond the horizontal protruding portion of the L-shaped lower spacer;

a high-concentration junction area formed to a first depth in the substrate beyond the L-shaped upper spacer;

a low-concentration junction area formed to a third depth in the substrate under the horizontal protruding portion of the L-shaped upper spacer,the first depth being greater than the third depth; and a medium-concentration junction area formed to a second depth in the substrate and positioned between the high- and low-concentration junction areas and beyond the vertical sidewall portion of the L-shaped upper spacer, the second depth being between the first and third depths.

2. The semiconductor transistor as claimed in claim 1, wherein the medium- and low-concentration junction areas are formed under the horizontal protruding portion of the L-shaped upper spacer.

3. The semiconductor transistor as claimed in claim 1, wherein the L-shaped lower spacer is made of silicon oxide.

4. The semiconductor transistor as claimed in claim 1, wherein the L-shaped upper spacer is made of a material having an etch selectivity with respect to the L-shaped lower spacer.

* * * * *